United States Patent
Skogö et al.

(10) Patent No.: US 11,138,428 B2
(45) Date of Patent: Oct. 5, 2021

(54) IMAGE SENSOR FOR VISION BASED HUMAN COMPUTER INTERACTION

(71) Applicant: Tobii AB, Danderyd (SE)

(72) Inventors: Mårten Skogö, Danderyd (SE); Peter Blixt, Danderyd (SE); Henrik Jönsson, Danderyd (SE)

(73) Assignee: Tobii AB, Danderyd (SE)

( * ) Notice: Subject to any disclaimer, the term of this patent is extended or adjusted under 35 U.S.C. 154(b) by 0 days.

(21) Appl. No.: 16/579,205

(22) Filed: Sep. 23, 2019

(65) Prior Publication Data

US 2020/0160052 A1  May 21, 2020

Related U.S. Application Data

(63) Continuation of application No. 15/482,421, filed on Apr. 7, 2017, now abandoned.

(60) Provisional application No. 62/319,666, filed on Apr. 7, 2016.

(51) Int. Cl.
| | |
|---|---|
| *G06K 9/00* | (2006.01) |
| *H01L 27/146* | (2006.01) |
| *H04N 5/225* | (2006.01) |
| *H04N 5/243* | (2006.01) |
| *H04N 5/33* | (2006.01) |
| *H04N 9/04* | (2006.01) |

(52) U.S. Cl.
CPC ....... *G06K 9/00604* (2013.01); *G06K 9/0061* (2013.01); *H01L 27/1461* (2013.01); *H01L 27/14621* (2013.01); *H01L 27/14649* (2013.01); *H04N 5/2256* (2013.01); *H04N 5/243* (2013.01); *H04N 5/332* (2013.01); *H04N 9/04553* (2018.08); *H04N 9/04559* (2018.08); *H04N 9/04515* (2018.08); *H04N 2209/047* (2013.01)

(58) Field of Classification Search
None
See application file for complete search history.

(56) References Cited

U.S. PATENT DOCUMENTS

| | | | | |
|---|---|---|---|---|
| 9,456,132 | B2* | 9/2016 | Borthakur | G06K 9/46 |
| 2010/0207958 | A1* | 8/2010 | Kimura | H04N 9/045 345/596 |
| 2011/0228097 | A1* | 9/2011 | Motta | H04N 9/045 348/164 |
| 2013/0202161 | A1* | 8/2013 | Shor | G06K 9/00241 382/118 |
| 2014/0184894 | A1* | 7/2014 | Motta | H04N 9/04557 348/362 |
| 2014/0267351 | A1* | 9/2014 | Klaus | H04N 1/58 345/589 |
| 2015/0029322 | A1* | 1/2015 | Ragland | G06K 9/00597 348/78 |
| 2015/0302251 | A1* | 10/2015 | Smith | G06K 9/4671 382/117 |

(Continued)

*Primary Examiner* — Frederick D Bailey
(74) *Attorney, Agent, or Firm* — Samuel I. Yamron

(57) ABSTRACT

According to the invention, an image sensor is disclosed. The image sensor may include a plurality of pixels. Each pixel of a first portion of the plurality of pixels may include a near-infrared filter configured to block red, green, and blue light; and pass near-infrared light. Each pixel of a second portion of the plurality of pixels may be configured to receive at least one of red, green, or blue light; and receive near-infrared light.

18 Claims, 12 Drawing Sheets

(56) References Cited

U.S. PATENT DOCUMENTS

| | | | |
|---|---|---|---|
| 2016/0179336 A1* | 6/2016 | Ambrus | G02B 27/017 715/768 |
| 2016/0188963 A1* | 6/2016 | Kim | H04N 5/23219 382/118 |
| 2016/0248953 A1* | 8/2016 | Fujita | H04N 9/735 |
| 2017/0053147 A1* | 2/2017 | Germaine | G06K 7/10732 |

* cited by examiner

= NIR ILLUMINATION

= NIR ILLUMINATION

= NIR ILLUMINATION

NO USER PRESENT

USER SITTING FAR BACK

USER SITTING CLOSE UP

CAMERA COVERED

IMAGE SENSOR FOR VISION BASED HUMAN COMPUTER INTERACTION

CROSS-REFERENCE TO RELATED APPLICATION

This application claims priority to U.S. patent application Ser. No. 15/482,421, filed Apr. 7, 2017, entitled "IMAGE SENSOR FOR VISION BASED HUMAN COMPUTER INTERACTION" which claims the benefit of Provisional U.S. Patent Application No. 62/319,666, filed Apr. 7, 2016, entitled "IMAGE SENSOR FOR VISION BASED HUMAN COMPUTER INTERACTION", the entire disclosure of which is hereby incorporated by reference, for all purposes, as if fully set forth herein.

BRIEF DESCRIPTION OF THE INVENTION

In one embodiment, an image sensor is provided. The image sensor may include a plurality of pixels. Each pixel of a first portion of the plurality of pixels may include a near-infrared filter configured to block red, green, and blue light; and pass near-infrared light. Each pixel of a second portion of the plurality of pixels may be configured to receive at least one of red, green, or blue light; and receive near-infrared light.

In another embodiment, a method for capturing images is provided. The method may include receiving light at a plurality of pixels. Receiving light at the plurality of pixels may include blocking red, green, and blue light at each pixel of a first portion of the plurality of pixels with a near-infrared filter. Receiving light at the plurality of pixels may also include receiving near-infrared light at each pixel of the first portion of the plurality of pixels. Receiving light at the plurality of pixels may further include receiving at least one of red, green, or blue light at each pixel of a second portion of the plurality of pixels. Receiving light at the plurality of pixels may additionally include receiving near-infrared light at each pixel of the second portion of the plurality of pixels.

In another embodiment, a non-transitory machine readable medium having instructions stored thereon for capturing images is provided. The instructions may be executable by one or more processors to process signals produced by a first portion of a plurality of pixels receiving light. Receiving light at the first portion of the plurality of pixels may include blocking red, green, and blue light at each pixel of the first portion of the plurality of pixels with a near-infrared filter. Receiving light at the first portion of the plurality of pixels may also include receiving near-infrared light at each pixel of the first portion of the plurality of pixels. The instructions may also be executable to process signals produced by a second portion of the plurality of pixels receiving light. Receiving light at the second portion of the plurality of pixels may include receiving at least one of red, green, or blue light at each pixel of the second portion of the plurality of pixels. Receiving light at the second portion of the plurality of pixels may also include receiving near-infrared light at each pixel of the second portion of the plurality of pixels.

BRIEF DESCRIPTION OF THE DRAWINGS

The present invention is described in conjunction with the appended figures.

Figure 1:
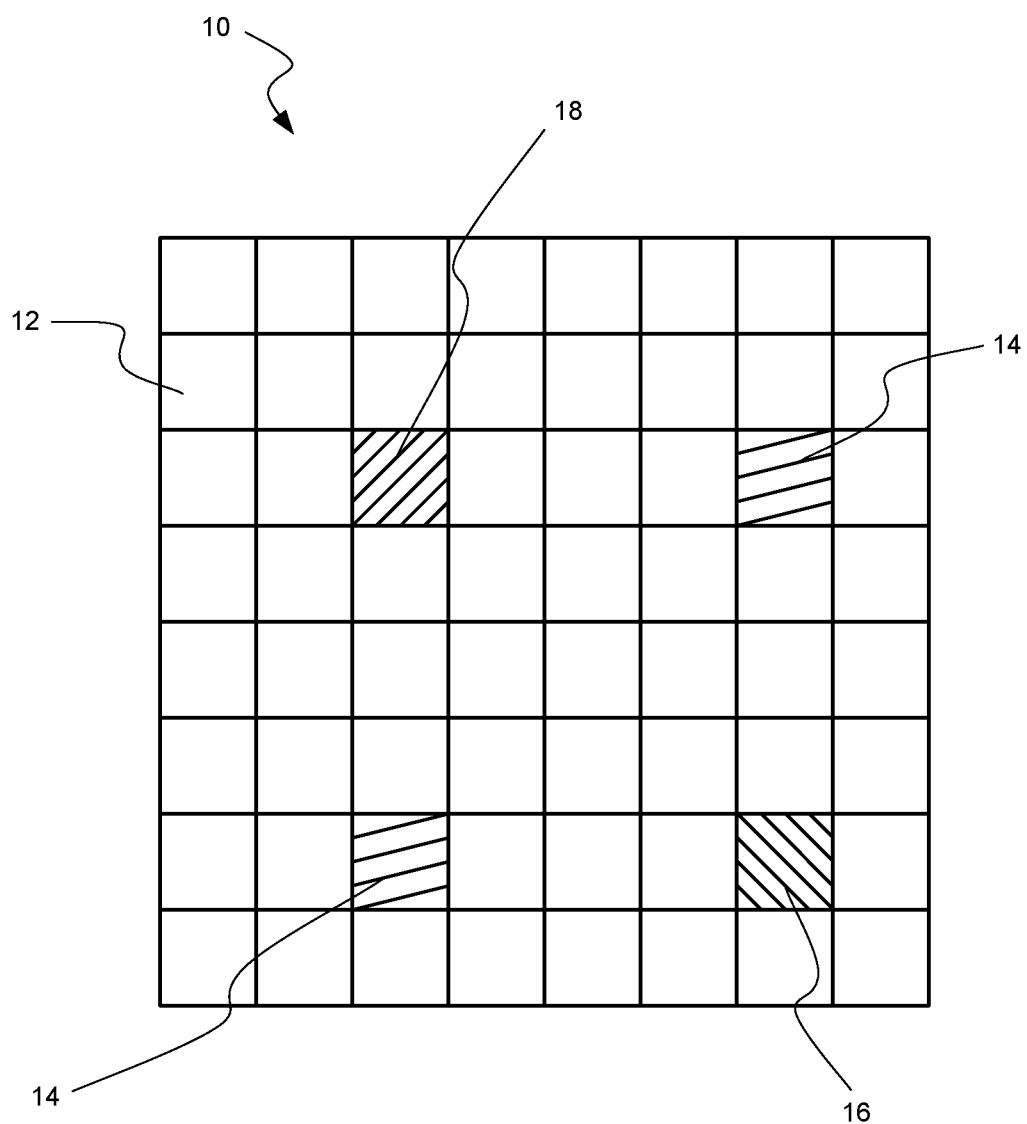
FIG. 1 is a diagram view of one image sensor of the invention.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The present invention generally relates to an image sensor particularly suited for vision based human computer interaction, and methods for using said image sensor.

Image sensors of different types, functions, and designs are well known. Typically an image sensor is adapted to function in a wide variety of fields.

Fundamentally an image sensor is comprised of a photo-sensitive substrate containing multiple photosites, when light photons are collected in a photosite—an electrical charge is produced. Typically one photosite is associated with one pixel of an image sensor. The size of the electrical charge is dependent on the amount of light collected, such that a brighter light will result in a higher charge. Once an exposure is complete, each photosites electrical charge is measured and turned into a digital value by an analogue-to-digital converter.

Two forms of image sensor technology comprise the majority of today's image sensors—CCD and CMOS image sensors. A Charge-Coupled Device (CCD) image sensor comprises multiple pixels represented by p-doped MOS capacitors. These capacitors allow for conversion of incoming photons into electron charges at the semiconductor-oxide interface, the CCD then reads out these charges via a gate structure that requires a separate power source.

The most common form of image sensor today is a CMOS image sensor, where the image sensor is an active pixel sensor made using Complementary Metal-Oxide-Semiconductor (CMOS) technology. Fundamentally the CMOS image sensor operates in the same way as a CCD image sensor, however it is manufactured using a much higher yield process. A CMOS image sensor contains a large array of transistors comprising a photodiode and amplifier. The photodiodes accumulate electrical charge when exposed to light, and those charges are then converted to voltage, amplified and transmitted as electrical signals.

CMOS image sensors typically consume less power than a CCD image sensor and can read out electrical charges much more rapidly.

As an image sensor fundamentally only records the level of light, in order to record color information a Bayer filter is typically used. A Bayer filter is a color filter bonded to the sensor substrate which allows only photons of a certain color to enter each pixel. By alternating the filter across the pixels between red, green and blue, light of different colors can be recorded by different adjacent pixels.

Although previous image sensors have been proposed for functioning with vision based human computer interaction, an image sensor using the techniques herein described has not been previously described, particularly for use in eye tracking technology.

It is an object of the present invention to propose an image sensor adapted to function with eye tracking, and other vision based human computer interaction technology.

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth herein.

For example, any detail discussed with regard to one embodiment may or may not be present in all contemplated versions of that embodiment. Likewise, any detail discussed with regard to one embodiment may or may not be present in all contemplated versions of other embodiments discussed herein. Finally, the absence of discussion of any detail with regard to embodiment herein shall be an implicit recognition that such detail may or may not be present in any version of any embodiment discussed herein.

Specific details are given in the following description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

The term "machine-readable medium" includes, but is not limited to transitory and non-transitory, portable or fixed storage devices, optical storage devices, wireless channels and various other mediums capable of storing, containing or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

To begin then, an object of the present invention is to provide an image sensor suitable for use with vision based human computer interaction. According to a first aspect of the present invention, there is provided an image sensor containing an integrated Bayer filter and near-infrared light (NIR) filter.

As would be readily understood by a person of skill in the art, a Bayer filter filters visible light apart from Red, Green or Blue (RGB) light from entering a pixel, or pixels, of an image sensor. An NIR filter typically prevents light below approximately 650 nanometers (nm) from entering a pixel, or pixels, of an image sensor. NIR light may be light at 850 nm, 905 nm, 940 nm, 1100 nm, and/or some other NIR wavelength.

As many vision based human computer interaction technologies, such as eye tracking, require infrared light to function, it is advantageous that an image sensor be adapted to incorporate both forms of filter.

Eye tracking is one example of a vision based human computer interaction technology. In eye tracking, at least one image sensor and at least one illuminator combine to determine the direction of a user's gaze. There are generally two types of eye tracking techniques: "Bright Pupil" (BP) and "Dark Pupil" (DP). BP eye tracking comprises an illumination source coaxial with the optical path of an image sensor, a user's eye then acts as a retroreflector as the light from the illumination source reflects off the retina, creating a bright pupil effect similar to red eye. If the illumination source is non-coaxial, as in DP eye tracking, then the pupil appears dark because the retroreflection from the retina is directed away from the camera.

Both eye tracking techniques function adequately, most often using Near Infrared Illumination. BP eye tracking creates greater iris/pupil contrast, but is more sensitive to ambient light such as is present outdoors. While DP eye tracking generally functions with more ethnicities than BP eye tracking. The present invention can function with either form of eye tracking.

In order to achieve an image sensor that filters both RGB and NIR light, several alternatives exist. Each will be described here in the context of the present invention.

In the first alternative, a sensor is provided with dimensions for example of 2,048 pixels×2,048 pixels. 15 out of 16 pixels have a filter associated therewith which allows only NIR light to enter, while 1 pixel out of 16 allows only Red, Green or Blue light as well as NIR light to enter. In some embodiments, the red, green, and blue pixels may include an NIR filter, and not allow NIR light to pass. In yet other embodiments, red, green, and blue pixels will not be present, possibly especially in embodiments where only eye tracking and not facial feature detection is necessary. In any embodiment discussed herein, different pixel layouts and resolutions may be employed than what is discussed or shown, as the specific embodiments disclosed are merely example configurations of the constructs disclosed.

This allows the image sensor to function as both a traditional RGB image sensor, as well as a NIR sensitive image sensor.

With reference to FIG. 1, a portion of an image sensor 10 is shown in simplified form for illustrative purposes. The image sensor 10 contains pixels 12, with filters responsive to NIR light only and pixels 14, 16 and 18 responsive to Red, Green and Blue light respectively.

In use, the image sensor may operate in multiple modes, as follows:

Mode 1—RGB

Figure 2:
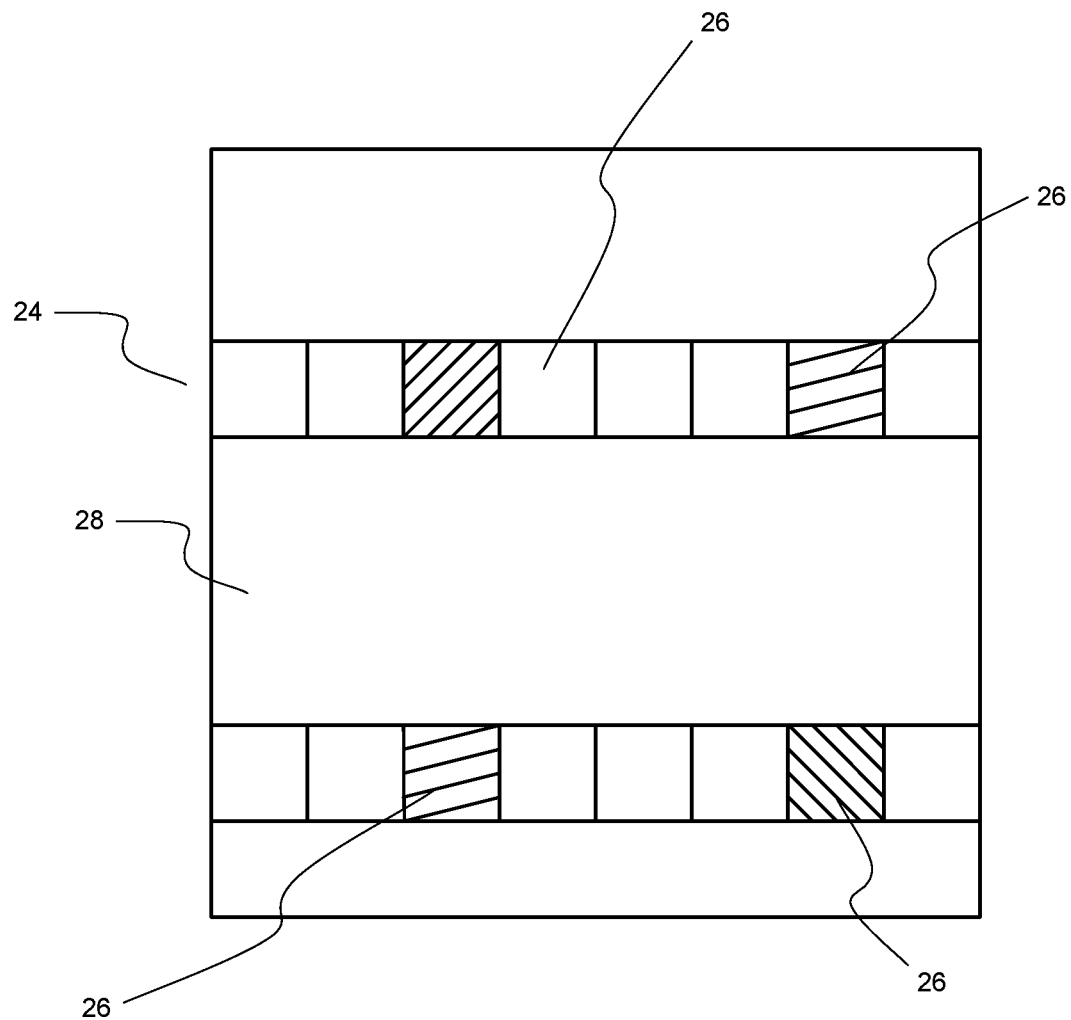
FIG. 2 is a diagram view of the image sensor of FIG. 1 where only two rows are being activated.

In RGB mode the image sensor may read out an image comprised of only pixels with associated RGB images. Typically this will be a subset of the total active image sensor area, for example if the image sensor comprises a matrix of 2,048×2,048 pixels, a 512×512 subset of the pixels may be read out from the image sensor where 3 out of 4 pixels on each row are skipped and 3 out of 4 rows are skipped such that only those pixels with an associated R, G or B filter are read out. FIG. 2 demonstrates how such images may be read out, where pixels that are read out are denoted by numerals 24, RGB pixels by numeral 26 and non-read out areas of the image sensor by numeral 28.

When reading out the image, only sensor lines having Red, Green, or Blue pixels are read out. The read-out data is run through a 1×3 kernel to subtract the average values of the adjacent NIR pixels from the Red, Green and Blue pixels respectively such that their values represent only the signal from the intended color. Subsequent to this only data from the quarter of the remaining pixels that represent the Red, Green, and Blue pixels that have been NIR compensated are kept. Data from the remaining three quarters of pixels are discarded.

Mode 2—Clean IR

A subset of the total image area, such as a 512×512 image may be read out from the image sensor in binning and/or skipping mode, all Red, Green, and Blue sensitive pixels are skipped so that only NIR sensitive pixels are read out. A first image is read out from the image sensor while the infrared light is activated, and then an identical second image is read out where the infrared light is not active. The second image is subtracted from the first image, resulting in a third image that comprises only infrared light—the so-called "Clean IR" image.

Ideally the two images should be captured very close in time to ensure minimal defects caused by objects having moved between the two images. The actively illuminated image may be captured before or after the non-lit image.

Mode 3—Region of Interest

In a Region of Interest mode (ROI), a subset of the active area of an image sensor is read out so as to contain within the image certain features. For example, in eye tracking it is known to read out only a portion of a total image area containing an eye, or eyes, of a user. See for example, U.S. Pat. No. 7,572,008 for more information. The entire disclosure of the aforementioned patent is hereby incorporated by reference, for all purposes, as if fully set forth herein.

In the present invention, a region of interest may be read out using just NIR sensitive pixels or including all pixels (also Red, Green and Blue) within an area. The concept of a Clean IR image can be used also when capturing region of interest images. Even if some of the pixels are sensitive also to visible light, the image remaining after subtraction of an ambient light image will only be the image caused by the active illumination, which in case of a NIR illuminator will be a NIR image.

A portion of the active area of an image sensor is read out while strobing NIR illumination from an illumination source. All pixels collect at least a portion of this strobed illumination, as well as ambient NIR illumination. The Red, Green and Blue pixels will also collect a portion of ambient visible light. These Red, Green and Blue pixels will thus have higher values than if they were pure NIR pixels. In an eye tracking device, in the case of a short exposure time, these images may still be used to determine a glint from the pupil of a user.

In this mode, the Red, Green and Blue pixels may register high values while the NIR pixels register relatively low values. This is due to the sensor having lower quantum efficiency at the wavelength of the NIR illumination than at the wavelengths of visible light. To minimize the impact of this issue and to better utilize the pixel dynamics, pixel gain and pixel offset can be set differently for NIR and Red, Green, and Blue pixels. For instance the gain of Red, Green and Blue pixels may be set lower than that of the NIR pixels. If this is the case it must later on be compensated for in the algorithms.

Alternatively, or additionally, the images may be captured as 10 or 12 bits of data per pixel, but then, especially in the mode of clean IR after having subtracted an ambient light image, the image may be transferred into 10, 8 or even fewer bits per pixel.

As an optional improvement, a processing device connected to the image sensor may interpolate data read out from the sensor to replace the Red, Green and Blue pixel values with average NIR values from adjacent pixels.

Further, in another aspect of the present invention, regions of interest read out of the image sensor may have varying characteristics. For example, the region of interest may be oriented horizontally or vertically. Further, more than one region of interest may be read out of the image sensor simultaneously.

Consider the example use case of eye tracking, in traditional imaging technology, one region of interest may be read out comprising both eyes of a user. This region of interest also comprises extra information, such as the area of the persons face between the two eyes. This extra information is not needed for eye tracking, and thus the power and data use in capturing this extra information is wasted. By reading out two regions of interest comprising substantially a single eye or pupil each, excess data and power is not consumed, and at the same time the read out time is minimized. If the sensor is of a rolling shutter type, this also means that the amount of ambient light being collected by the sensor is minimized.

By reading out regions of interest with varying orientations, the image sensor may function in multiple orientations. For example, it is advantageous, due to the natural shape of an eye, to read out a substantially landscape view of a user's eye. In a normally oriented image sensor, this is possible due to the image sensor having typically a landscape layout of pixels (a larger size in the x-dimension than in the y-dimension), but if the image sensor is rotated (such as may be the case in portable device such as a phone or tablet), the image sensor cannot read out a landscape region of interest comprising only an eye. In order to capture the entire eye or pupil, the image sensor would have to read out a large portrait image.

In order to affect a rectangular or square image readout, multiple regions, such as four, may be read out forming a rectangle or square. These may be read out using a standard image transfer format such as the MIPI standard published by The MIPI Alliance (www.mipi.org). Alternatively the read out interface may be a sensor internal interface that transfers image data to a second layer of the sensor containing processing capabilities. This kind of 3D stacked sensors containing an active photosensing layer stacked with a processing layer and often also a third memory/RAM layer have become more and more common in the last year, specifically in smart phones. These four regions of interest may be used to form any orientation of shape, for example they may be used to form a diagonally oriented shape.

Further, it is known that power consumption scales at an approximate rate to the increase in read out area. By not reading out the area between the eyes, pixels and analog-to-digital converters (ADCs) can be powered down for those areas. An image sensor according to the current state of the art reads out complete rows, which provides unnecessary power for pixels not of interest.

One specific implementation for multiple region of interests that is optimized for eye tracking purposes is to always have four non-overlapping equally sized regions of interest read out, for example each region may be 120×120 pixels in size. The sum of these regions of interests are placed to include the expected positions of the two eyes of a person located in front of an eye tracker comprising an image sensor according to the present invention.

Further, there is also an additional restriction that the two top most regions of interest are always located on the same rows, the two bottom most are also located on the same rows, the two left most are located on the same columns and the two right most are located on the same columns. Thus, for a given size of the regions of interest only two 'x' coordinates and two 'y' coordinates are needed to fully define the regions to read out.

The four regions of interest, each being 120×120 pixels, is then read out and combined into a single 240×240 image. Alternatively an image of 240×241 pixels may be sent out from the sensor where the first or last line may include meta data describing the coordinates of the regions of interests on the sensor and other data of relevance for the algorithms to be able to use the image.

The benefit of this approach is that the read out time for a multiple regions of interest image will be the same independent of the head orientation of a user and read out area is minimized to lower the negative impact of ambient light on the performance of the eye tracker.

Additionally, if a user is leaning forward towards an eye tracker and due to their proximity to the eye tracker, the eyes of the person, too large to fit within a 120×120 region of interest, the sensor may enter a mode using 2×2 skipping yet still operating in the previously described mode in order to reduce all objects to half size in image pixels while still keeping the same read out format and approximately the same read out time.

Figure 6:
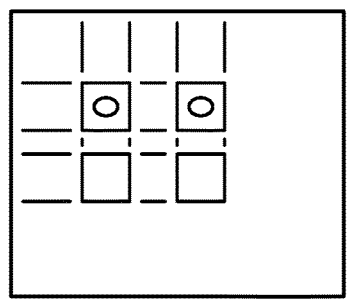
FIG. 6 is a diagram view of various configurations of multiple areas of interest imaged by image sensors of the invention.
Figure 6:
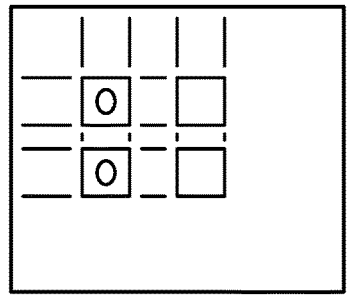
Figure 6:
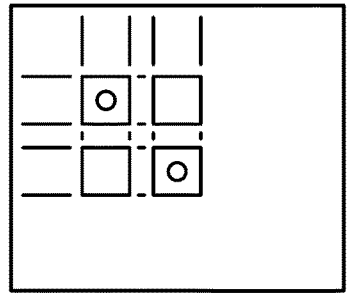
Figure 6:
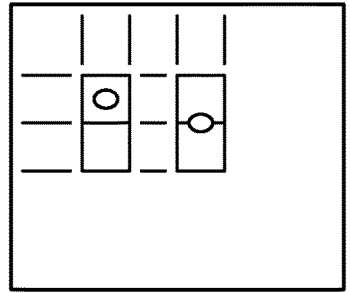
Figure 6:
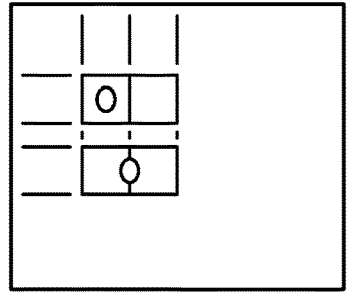

In order to illustrate this aspect of the present invention, FIG. 6 shows various possible orientations for multiple regions of interest. In FIG. 6, a user's eyes are displayed as circles, and regions of interest are shown as squares.

Binning and Skipping

Figure 3:
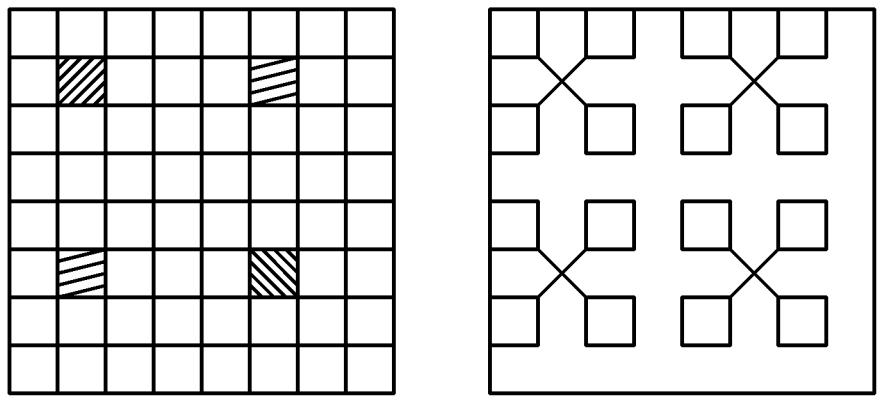
FIG. 3 is a diagram view of another image sensor of the invention where binning is employed.
Figure 4:
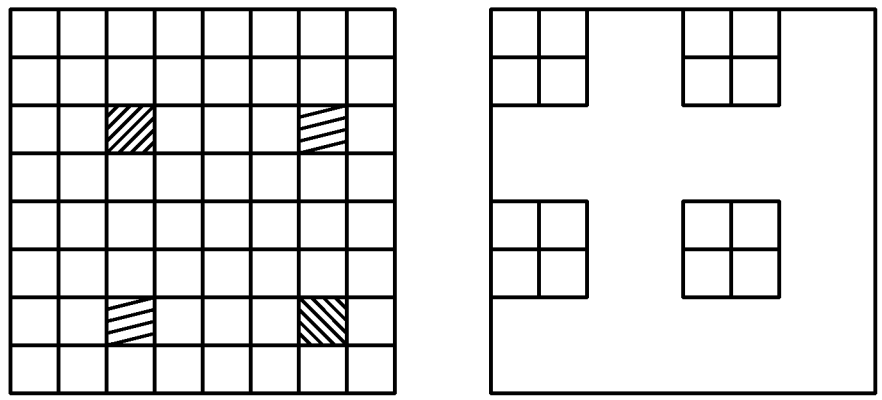
FIG. 4 is a diagram view of the image sensor of FIG. 1 where skipping is employed.

According to the present invention, two different forms of binning and/or skipping may be used. These are demonstrated in FIG. 3 and FIG. 4. FIG. 3 allows for a low resolution image where it is often possible to determine a glint in an eye tracking system since the gaps between pixels that are read out are fairly small so no imaged objects can fall between read out pixels.

Burst Sequence

Figure 5:
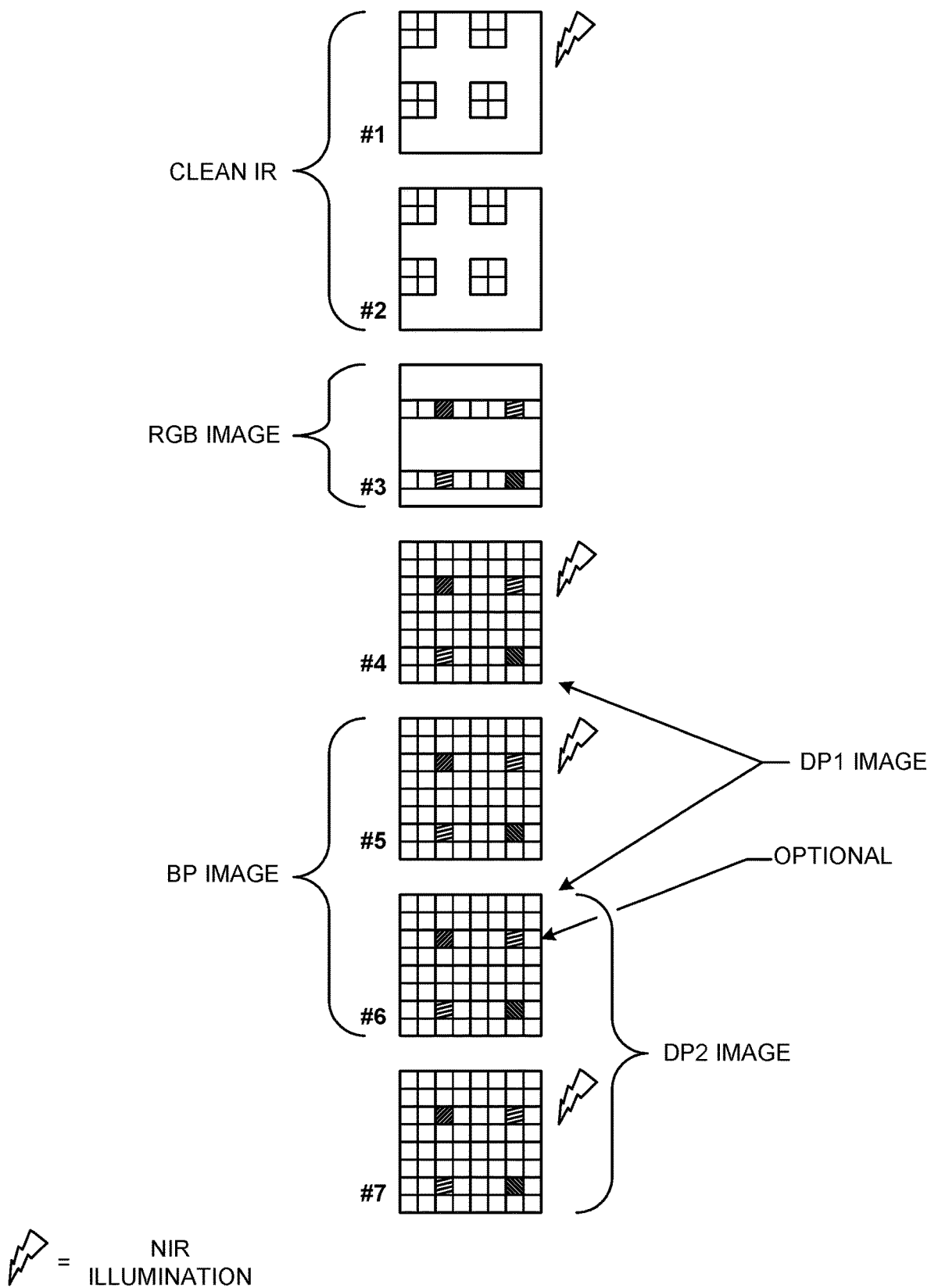
FIG. 5 is a diagram view of a sequence of images obtained in a single cycle of a bust mode imaging process.

According to the present invention, it is possible to operate the image sensor in a burst sequence of several modes. FIG. 5 shows an example of such a sequence.

In this example sequence, which may be performed in any order, a first and second image are read out in accordance with the Clean IR aspect of the invention previously described. A third image is then read out from the image sensor according to the RGB aspect of the present invention previously described. Following this third image are four Region of Interest (ROI) images according to the previously described aspect of the present invention.

These four ROI images will now be described in greater detail in the context of their use in an eye tracking system. In an eye tracking system it is desirable to generate images which illustrate a "dark pupil" effect and images which illustrate a "bright pupil" effect. These effects and their use in eye tracking have been previously described in this specification, and would be readily understood by a person of skill in the art.

The fourth image in the sequence is an ROI image having the DP effect, namely an illuminator off-axis from the image sensor has emitted infrared illumination towards the pupil of a user. The fifth and optional sixth images of the sequence are ROI images having the BP effect, namely an illuminator on-axis with the image sensor has emitted infrared illumination towards the pupil of a user. The seventh and final image in the sequence is an ROI image captured with the DP illuminator lit. Optionally, the optional sixth image including only ambient light may be subtracted from the seventh and/or the fourth image in the sequence in order to subtract ambient light and isolate only active illumination in the DP images. The primary trade-off here is that the images have been captured further apart in time and subtraction of one from the other has a higher risk of adding artefacts due to objects having moved between the exposures.

In a further aspect of the present invention, it is possible to read out a sequence of images only comprising images suitable for eye tracking. In this aspect of the present invention, this sequence of images is approximate to the fourth, fifth, sixth and seventh images in the previously described sequence of images.

It is preferable to have a sensor where a full image sequence (i.e., a burst mode) can be programmed at once, including illumination type and timing, exposure times, gain, binning/skipping, ROI size and position, etc. for each image. In some embodiments, only the ROI size/position of the overall available image may be updated for subsequent images while in burst mode.

It is also preferable to have the sensor go into a low power mode directly after the image sequence has been captured. In this low power mode the sensor should preferably still be responsive to reprogramming of the next image sequence while most of the other parts of the sensor are asleep.

As described herein, an image sensor is therefore adapted to allow for three forms of images: RGB, subsampled images through binning or skipping, and ROI or cropped images. For the latter two types of images, two subsequent image captures, one with active illumination and one without, may be used to create a Clean IR version of the image. This image sensor therefore may function in a variety of modes suitable for use in vision based human computer interaction. For example, an RGB image may be used for facial identification, imaging such as Skype, regular image capture and the like, anti-spoofing when combined with NIR image based biometrics such as face or iris, or for determining eye position to guide Region of Interest readout, a subsampled image (Clean IR image or just a single illuminated image) may be used for facial recognition, facial feature tracking, or for determining eye position to guide Region of Interest readout, and Region of Interest images may be used for eye tracking.

Figure 8:
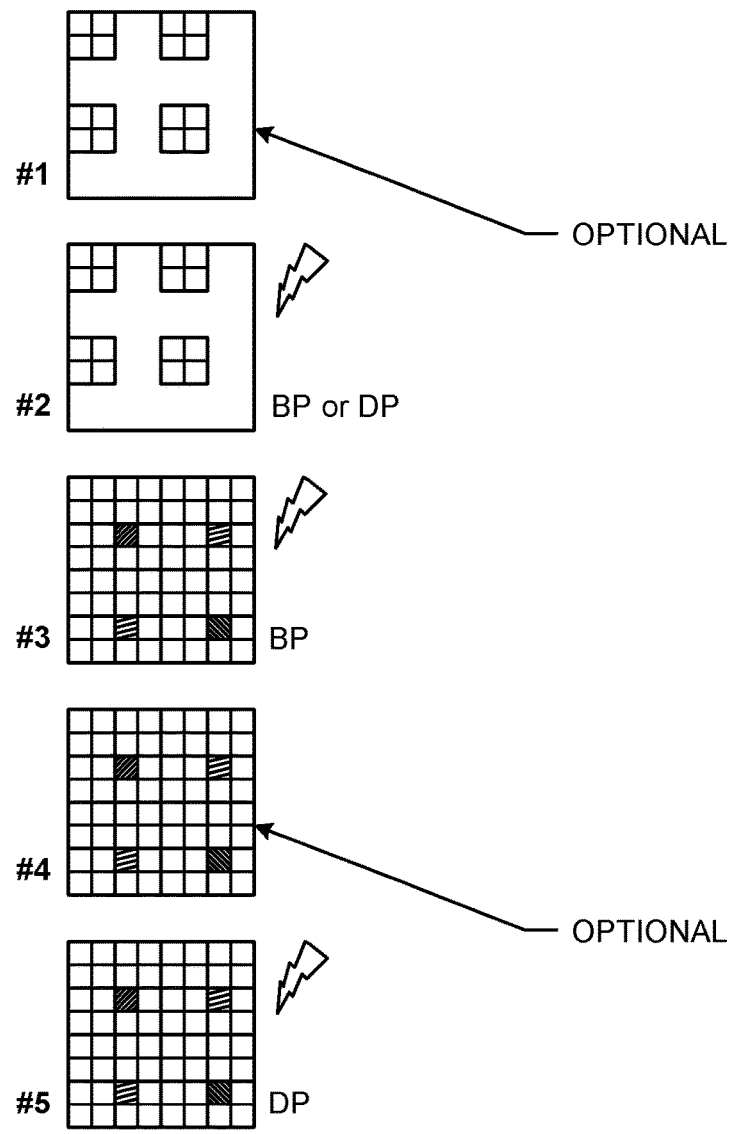
FIG. 8 is a diagram view of a sequence of images obtained in a single cycle of another bust mode imaging process.
Figure 8:

Another possible burst sequence which may be employed by image sensors described herein may include a sequence useful for low-power draw eye tracking and recognition of facial features, and is discussed with reference to FIG. 8. In this burst sequence, three to five frames may include data received for one imaging cycle. An optional first frame may include a binned or skipped NIR image (2×2 skipped and 2×2 binned shown). A second frame may also include a binned or skipped NIR image during a period of illumination by a NIR illuminator (2×2 skipped and 2×2 binned shown). A third frame in a region of interest may include a combined NIR and RGB image during a period of illumination by a NIR illuminator. An optional fourth frame in a region of interest may include a combined NIR and RGB image. A fifth frame in a region of interest may include a combined NIR and RGB image during a period of illumination by a NIR illuminator. The second and third frames described may be employed in BP eye tracking, while the second and fifth frames may be employed for DP eye tracking. In some embodiments, the image sensor employed in this or other sequences may be a NIR-only sensor, without visible light or RGB pixels. This may be a useful solution for eye tracking, facial feature tracking, and/or machine vision with active NIR illumination. While such a sensor cannot output RGB images, it can perform the NIR functions detailed herein.

Figure 9:
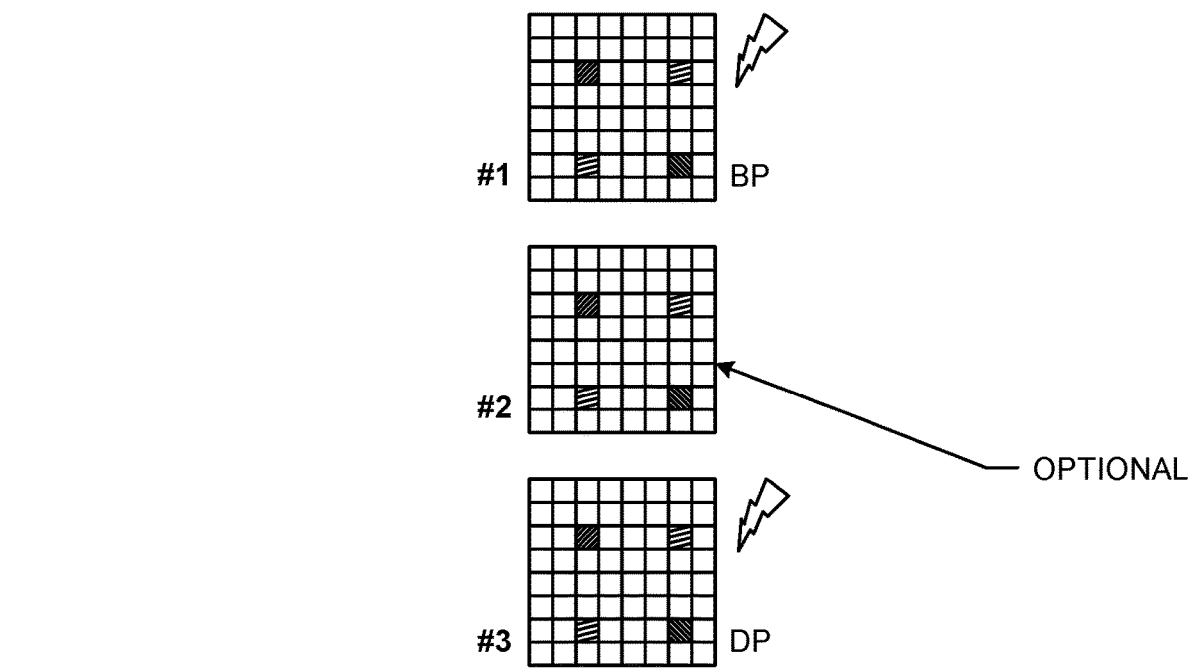
FIG. 9 is a diagram view of a sequence of images obtained in a single cycle of another bust mode imaging process.
Figure 9:

Another possible burst sequence which may be employed by image sensors described herein may include a sequence useful for low-power draw eye tracking, and is discussed with reference to FIG. 9. In this burst sequence, two to three frames may include data received for one imaging cycle. A first frame in a region of interest may include a combined NIR and RGB image during a period of illumination by a NIR illuminator. An optional second frame in a region of interest may include a combined NIR and RGB image. A third frame in a region of interest may include a combined NIR and RGB image during a period of illumination by a NIR illuminator. The first frame described may be employed in BP eye tracking, while the third frame may be employed for DP eye tracking. In some embodiments, the image sensor employed in this or other sequences may be a NIR-only sensor, without visible light or RGB pixels. This may be a useful solution for eye tracking, facial feature tracking, and/or machine vision with active NIR illumination. While such a sensor cannot output RGB images, it can perform the NIR functions detailed herein.

Figure 10:
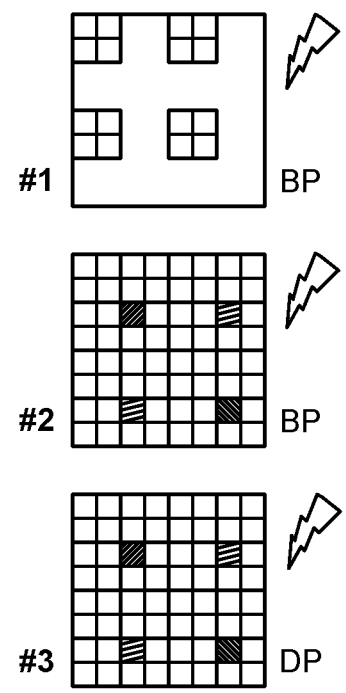
FIG. 10 is a diagram view of a sequence of images obtained in a single cycle of another bust mode imaging process.
Figure 10:

Another possible burst which may be employed by image sensors described herein may include a sequence useful for low-power draw eye tracking and recognition of facial features, and is discussed with reference to FIG. 10. In this burst sequence, three frames may include data received for one imaging cycle. A first frame may include a binned or skipped NIR image during a period of illumination by a NIR illuminator (2×2 skipped and 2×2 binned shown). A second frame in a region of interest may include a combined NIR and RGB image during a period of illumination by a NIR illuminator. A third frame in a region of interest may also include a combined NIR and RGB image during a period of illumination by a NIR illuminator. The first and second frames described may be employed in BP eye tracking, while the third frame may be employed for DP eye tracking. In some embodiments, the image sensor employed in this or other sequences may be a NIR-only sensor, without visible light or RGB pixels. This may be a useful solution for eye tracking, facial feature tracking, and/or machine vision with active NIR illumination. While such a sensor cannot output RGB images, it can perform the NIR functions detailed herein.

Figure 11:
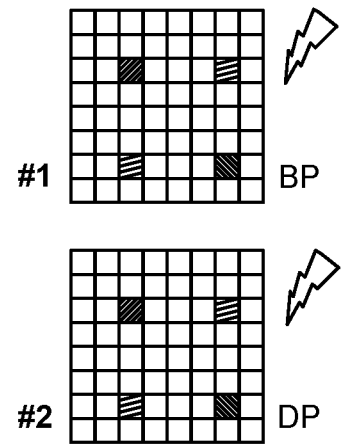
FIG. 11 is a diagram view of a sequence of images obtained in a single cycle of another bust mode imaging process.
Figure 11:

Another possible burst which may be employed by image sensors described herein may include a sequence useful for low-power draw eye tracking, and is discussed with reference to FIG. 11. In this burst sequence, two frames may include data received for one imaging cycle. A first frame may include in a region of interest may include a combined NIR and RGB image during a period of illumination by a NIR illuminator. A second frame in a region of interest may also include a combined NIR and RGB image during a period of illumination by a NIR illuminator. The first frame described may be employed in BP eye tracking, while the second frame may be employed for DP eye tracking. In some embodiments, the image sensor employed in this or other sequences may be a NIR-only sensor, without visible light or RGB pixels. This may be a useful solution for eye tracking, facial feature tracking, and/or machine vision with active NIR illumination. While such a sensor cannot output RGB images, it can perform the NIR functions detailed herein.

Other possible imaging sequences, using either a combined RGB/NIR sensor, as described herein, or a NIR-only sensor as also described herein, may be possible within the scope of the invention. Merely by way of example, such imaging sequences may include sequences disclosed in U.S. Patent Publication No. 2015/0262010, the entire disclosure of which is hereby incorporated by reference, for all purposes, as if fully set forth herein.

Figure 12:
FIG. 12 is a diagram view of different Clean IR images potentially registering the presence or absence of a user in view of image sensors of the invention.
Figure 12:
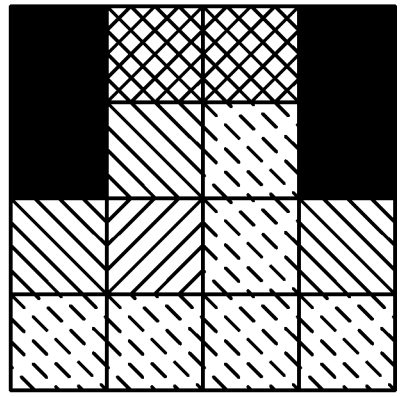
Figure 12:
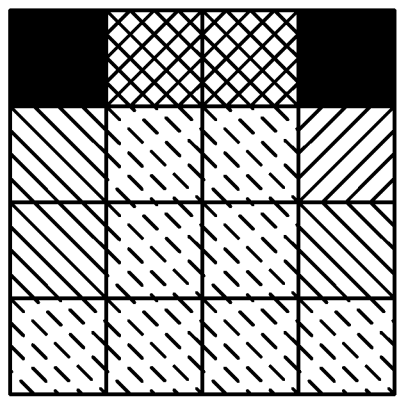
Figure 12:
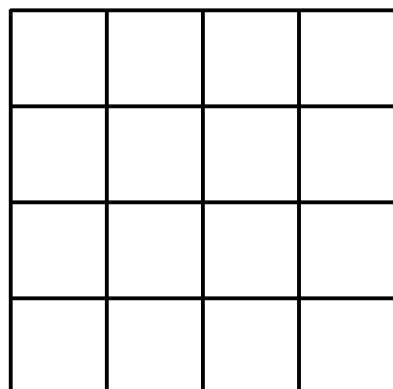

In another embodiment, the image sensors described herein may be useful for determining the presence of a user using low power Clean IR imaging sequences as described herein. A computing device may be in a sleep mode, and only a relevant imaging sensor may be operational to determine when the computing device should be woken. In some of these embodiments, the sensor may be set to operate in an extreme sub sampling mode to achieve very low resolution, where preferable a large number of pixels are binned together to increase the sensor's signal to noise. In some cases, some skipping is used to capture a frame during a period of illumination by a NIR illuminator followed closely in time by a frame from the same pixels without the NIR illumination. In this manner a Clean IR image is produced from the image sensor as described herein. As shown in FIG. 12, different Clean IR images of very low resolution may be produced during various states of user presence (or non-presence) in front of the image sensor. By binning a large number of pixels, these images may be achieved with acceptable signal to noise at extremely short exposure times. In addition, these images may be achieved with low power consumption from illumination and also short time between the lit and the unlit image used to create the Clean IR image, thus minimizing motion or other temporal artefacts.

From the Clean IR images receiving in this process, two parameters may be extracted: the maximum pixel value, and the average pixel value. In one embodiment, if (A) the maximum pixel value is less than a first value, (B) the average pixel value is greater than a second value but less than a third value, (C) the quotient of the maximum pixel value divided by the average pixel value is greater than a fourth value but less than a fifth value, and (D) the quotient of the average pixel value divided by the average pixel value of the previous image to the current image is greater than a sixth value but less than a seventh value, then the presence of a user is potentially detected. The first through sixth value are predetermined or dynamic and set to facilitate these variables being useful for detecting user presence. The process is repeated and at a certain threshold total number of potential detections, a user determined to be likely present and the computing device is awoken by a processor so instructed. If any of the above comparisons are false however, the entire process repeats by resetting the number of potential detections to zero and beginning analysis of images per the above anew. In general, any kind of machine vision algorithm can be used to detect presence. In some embodiments using a Clean IR image, only what is illuminated by the active NIR illuminator of the system is detected. A person sitting closer to the illuminator may appear brighter and larger, and a person sitting farther away may appear smaller and less bright. If the person is too close or almost covering the lens in front of the sensor, the illuminator may also be covered and the sensor will capture a pure white image. If a human head and upper body is to be captured within a predefined distance from the sensor (e.g., 20-70 cm from the sensor), it is possible to set one or more thresholds indicating the size and brightness of the object being captured. For example, a threshold indicating a first size or brightness may indicate someone or something closer than 20 cm from the sensor (e.g., the captured object is too large and/or too bright). Similarly, another threshold indicating a second size or brightness may indicate someone or something farther from 70 cm from the sensor (e.g., the object is too small and/or too dark to trigger the system). Although 20 cm and 70 cm are provided as examples, other distances or criteria may be used.

Figure 7:
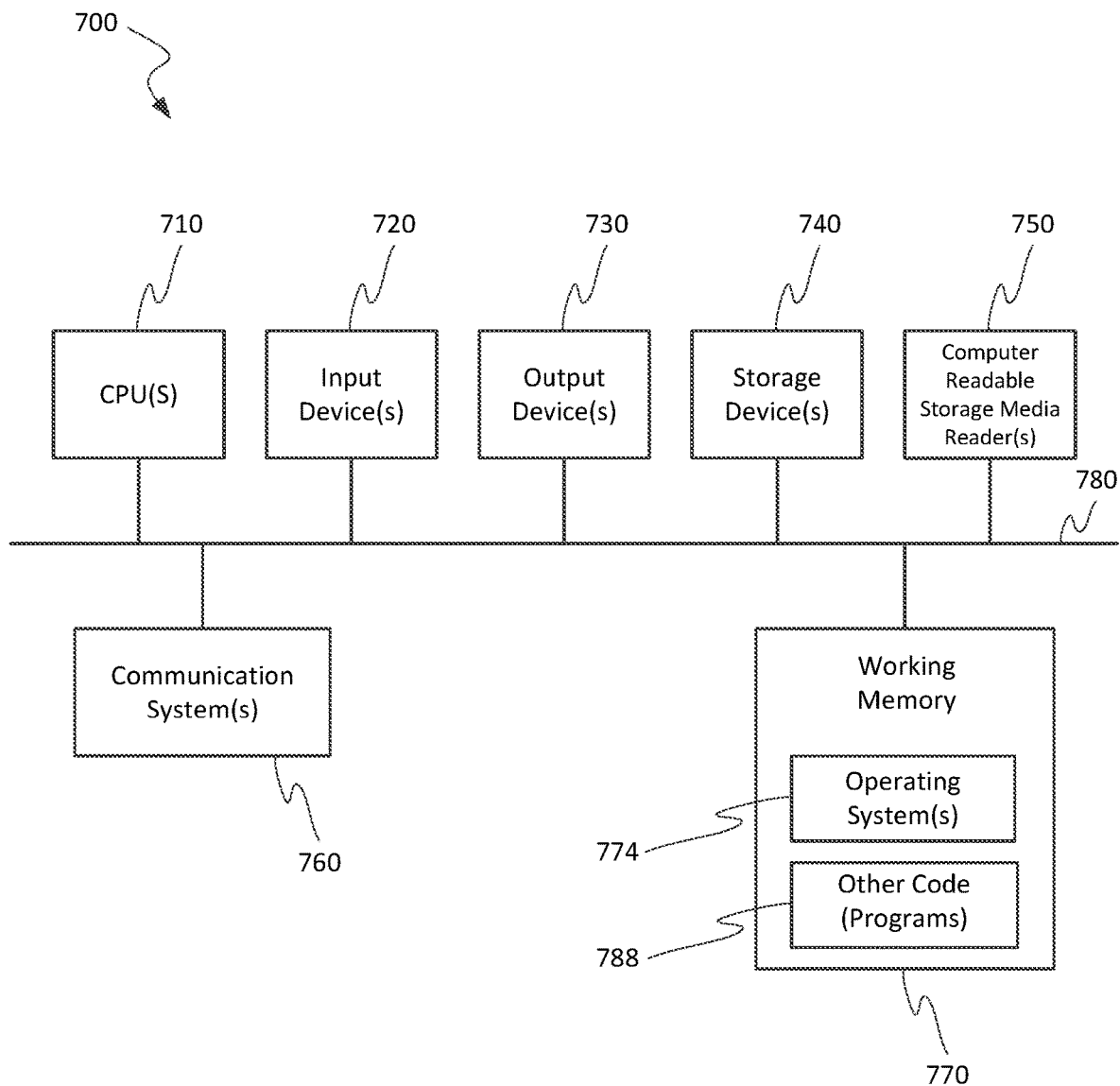
FIG. 7 is a block diagram of an exemplary computer system capable of being used in at least some portion of the apparatuses or systems of the present invention, or implementing at least some portion of the methods of the present invention.

FIG. 7 is a block diagram illustrating an exemplary computer system 700 in which embodiments of the present invention may be implemented. This example illustrates a computer system 700 such as may be used, in whole, in part, or with various modifications, to provide the functions of the components of the invention such as those discussed above. For example, any of the functions discussed above of the image sensor may be controlled by the computer system 700.

The computer system 700 is shown comprising hardware elements that may be electrically coupled via a bus 790. The hardware elements may include one or more central processing units 710, one or more input devices 720 (e.g., a mouse, a keyboard, etc.), and one or more output devices 730 (e.g., a display device, a printer, etc.). The computer system 700 may also include one or more storage device 740. By way of example, storage device(s) 740 may be disk drives, optical storage devices, solid-state storage device such as a random access memory ("RAM") and/or a read-only memory ("ROM"), which can be programmable, flash-updateable and/or the like.

The computer system 700 may additionally include a computer-readable storage media reader 750, a communications system 760 (e.g., a modem, a network card (wireless or wired), an infra-red communication device, Bluetooth™ device, cellular communication device, etc.), and working memory 780, which may include RAM and ROM devices as described above. In some embodiments, the computer system 700 may also include a processing acceleration unit 770, which can include a digital signal processor, a special-purpose processor and/or the like.

The computer-readable storage media reader 750 can further be connected to a computer-readable storage medium, together (and, optionally, in combination with storage device(s) 740) comprehensively representing remote, local, fixed, and/or removable storage devices plus storage media for temporarily and/or more permanently containing computer-readable information. The communications system 760 may permit data to be exchanged with a network, system, computer and/or other component described above.

The computer system 700 may also comprise software elements, shown as being currently located within a working memory 780, including an operating system 784 and/or other code 788. It should be appreciated that alternate embodiments of a computer system 700 may have numerous variations from that described above. For example, customized hardware might also be used and/or particular elements might be implemented in hardware, software (including portable software, such as applets), or both. Furthermore, connection to other computing devices such as network input/output and data acquisition devices may also occur.

Software of computer system 700 may include code 788 for implementing any or all of the function of the various elements of the architecture as described herein. For example, software, stored on and/or executed by a computer system such as system 700, can provide the functions of components discussed herein, and/or other components of the invention such as those discussed above. Methods implementable by software on some of these components have been discussed above in more detail.

The invention has now been described in detail for the purposes of clarity and understanding. However, it will be appreciated that certain changes and modifications may be practiced within the scope of the appended claims.

The invention claimed is:

1. An image sensor comprising:
    a plurality of pixels wherein each pixel of a first portion of the plurality of pixels comprises a near-infrared filter configured to:
        block red, green, and blue light; and
        pass at least a portion of near-infrared light; and
    each pixel of a second portion of the plurality of pixels is configured to:
        receive at least one of red, green, or blue light; and
        receive near-infrared light,
    wherein the image sensor further comprises:
        at least one processor configured to process information from the plurality of pixels in at least two modes,
    wherein:
        in a first mode, the at least one processor is configured to return data characterizing at least one of red, blue, and green light received by the plurality of pixels; and in a second mode, the at least one processor is configured to return data characterizing near-infrared light received by the plurality of pixels,
wherein in either one of the first mode or the second mode, the at least one processor is further configured to:
receive data from only a sub-portion of the first portion of the plurality of pixels and only a sub-portion of the second portion of pixels.

2. The image sensor of claim 1, wherein:
the first portion of the plurality of pixels comprises substantially 15 out of every 16 pixels in the plurality of pixels; and
the second portion of the plurality of pixels comprises substantially one out of every 16 pixels in the plurality of pixels.

3. The image sensor of claim 1, wherein being configured to return data characterizing at least one of red, blue, and green light received by the plurality of pixels comprises being configured to:
receive data from only the second portion of the plurality of pixels; and
process the data from only the second portion of the plurality of pixels.

4. The image sensor of claim 1, wherein being configured to return data characterizing at least one of red, blue, and green light received by the plurality of pixels comprises being configured to:
receive data from both the first portion of the plurality of pixels and the second portion of the plurality of pixels;
remove data received from the first portion of the plurality of pixels; and
process the data remaining from the second portion of the plurality of pixels.

5. The image sensor of claim 1, wherein being configured to return data characterizing near-infrared light received by the plurality of pixels comprises being configured to:
receive a first set of data from both the first portion of the plurality of pixels and the second portion of the plurality of pixels produced during activation of a near-infrared illuminator;
receive a second set of data from both the first portion of the plurality of pixels and the second portion of the plurality of pixels produced when the near-infrared illuminator is not activated; and
process the first set of data and the second set of data.

6. The image sensor of claim 5, wherein processing the first set of data and the second set of data comprises:
comparing the first set of data to the second set of data.

7. The image sensor of claim 5, wherein:
a time the first set of data is produced is substantially close in time to a time the second set of data is produced.

8. The image sensor of claim 1, wherein:
the sub-portion of the first portion of the plurality of pixels and the sub-portion of the second portion of the plurality of pixels represent four non-overlapping equally sized regions of pixels of the plurality of pixels.

9. The image sensor of claim 1, wherein:
the four non-overlapping equally sized regions of pixels of the plurality of pixels are defined by a two pairs of x/y coordinates.

10. The image sensor of claim 9, wherein a size of each of the four non-overlapping equally sized regions is based at least in part on characteristics of a user observed by the image sensor.

11. The image sensor of claim 9, wherein a size of each of the four non-overlapping equally sized regions is based at least in part on at least one of a size or a location of a user's eye observed by the image sensor.

12. The image sensor of claim 1, wherein in either one of the first mode or the second mode, the at least one processor is further configured to at least:
adjust a gain level of the data received from the first portion of the plurality of pixels or a gain level of the data received from the second portion of the plurality of pixels.

13. The image sensor of claim 12, wherein adjusting the gain level of the data received from the second portion of the plurality of pixels comprises:
reducing the gain level of the data received from the second portion of the plurality of pixels.

14. The image sensor of claim 1, wherein in the second mode, the at least one processor is further configured to:
interpolate the data from the first portion of the plurality of pixels to determine data representing an estimate of the near-infrared light received at the second portion of the plurality of pixels.

15. The image sensor of claim 1, wherein the image sensor is disposed in an eye tracking device in a virtual reality headset, an augmented reality headset, or a display headset.

16. The image sensor of claim 1, wherein the image sensor further comprises:
a processing layer disposed beneath the plurality of pixels and communicatively coupled therewith; and
a memory layer disposed beneath the processing layer and communicatively coupled therewith.

17. A method for capturing images, wherein the method comprises:
receiving light at a plurality of pixels, and
processing, by at least one processor, information from the plurality of pixels in at least two modes,
wherein receiving light at the plurality of pixels comprises:
blocking red, green, and blue light at each pixel of a first portion of the plurality of pixels with a near-infrared filter; and
receiving near-infrared light at each pixel of the first portion of the plurality of pixels;
receiving at least one of red, green, or blue light at each pixel of a second portion of the plurality of pixels; and
receiving near-infrared light at each pixel of the second portion of the plurality of pixels; and
processing, by at least one processor, information from the plurality of pixels in at least two modes comprises:
in a first mode, the at least one processor returning data characterizing at least one of red, blue, and green light received by the plurality of pixels;
in a second mode, the at least one processor returning data characterizing near-infrared light received by the plurality of pixels; and
in either one of the first mode or the second mode, the at least one processor receiving data from only a sub-portion of the first portion of the plurality of pixels and only a sub-portion of the second portion of the plurality of pixels.

18. A non-transitory machine readable medium having instructions stored thereon for capturing images, wherein the instructions are executable by one or more processors to at least:
process signals produced by a first portion of a plurality of pixels receiving light, wherein receiving light at the first portion of the plurality of pixels comprises:

blocking red, green, and blue light at each pixel of the first portion of the plurality of pixels with a near-infrared filter; and receiving near-infrared light at each pixel of the first portion of the plurality of pixels;

process signals produced by a second portion of the plurality of pixels receiving light, wherein receiving light at the second portion of the plurality of pixels comprises:

receiving at least one of red, green, or blue light at each pixel of the second portion of the plurality of pixels; and receive near-infrared light at each pixel of the second portion of the plurality of pixels;

processing, by at least one processor, information from the plurality of pixels in at least two modes, wherein in a first mode, the at least one processor returns data characterizing at least one of red, blue, and green light received by the plurality of pixels;

in a second mode, the at least one processor returns data characterizing near-infrared light received by the plurality of pixels; and in either one of the first mode or the second mode, the at least one processor receives data from only a sub-portion of the first portion of the plurality of pixels and only a sub-portion of the second portion of the plurality of pixels.

\* \* \* \* \*